United States Patent
Zhang et al.

(10) Patent No.: US 10,800,940 B2
(45) Date of Patent: Oct. 13, 2020

(54) PROCESS FOR PRODUCING A PATTERNED TRANSPARENT CONDUCTIVE FILM AND A TRANSPARENT CONDUCTIVE FILM

(71) Applicant: BASF SE, Ludwigshafen (DE)

(72) Inventors: Rui Zhang, West New York, NJ (US); Garo Khanarian, Princeton, NJ (US); Herve Dietsch, Bad Duerkheim (DE); Nikolay A. Grigorenko, Moehlin (CH); Olivier Enger, Therwil (CH)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 15/566,262

(22) PCT Filed: Apr. 14, 2016

(86) PCT No.: PCT/EP2016/058180
§ 371 (c)(1),
(2) Date: Oct. 13, 2017

(87) PCT Pub. No.: WO2016/166190
PCT Pub. Date: Oct. 20, 2016

(65) Prior Publication Data
US 2018/0134908 A1 May 17, 2018

Related U.S. Application Data

(60) Provisional application No. 62/148,207, filed on Apr. 16, 2015.

(51) Int. Cl.
| | | |
|---|---|---|
| *C09D 11/52* | (2014.01) | |
| *C09D 11/037* | (2014.01) | |
| *H05K 1/09* | (2006.01) | |
| *C09D 11/14* | (2006.01) | |
| *C23C 18/06* | (2006.01) | |
| *H01B 1/20* | (2006.01) | |
| *H01B 5/14* | (2006.01) | |
| *C08K 7/06* | (2006.01) | |
| *C08K 3/08* | (2006.01) | |

(52) U.S. Cl.
CPC .......... *C09D 11/52* (2013.01); *C09D 11/037* (2013.01); *C09D 11/14* (2013.01); *C23C 18/06* (2013.01); *H01B 1/20* (2013.01); *H01B 5/14* (2013.01); *H05K 1/097* (2013.01); *C08K 7/06* (2013.01); *C08K 2003/0806* (2013.01); *C08K 2201/001* (2013.01); *C08K 2201/004* (2013.01); *C08K 2201/011* (2013.01); *H05K 2201/026* (2013.01)

(58) Field of Classification Search
CPC .................................................. C09D 11/52
See application file for complete search history.

(56) References Cited

U.S. PATENT DOCUMENTS

| | | | |
|---|---|---|---|
| 7,645,497 B2 * | 1/2010 | Spath | B82Y 10/00 345/173 |
| 8,018,568 B2 | 9/2011 | Allemand et al. | |
| 2006/0275705 A1 | 12/2006 | Dorogy et al. | |
| 2007/0074316 A1 | 3/2007 | Alden et al. | |
| 2009/0068241 A1 | 3/2009 | Britz et al. | |
| 2013/0206227 A1 | 8/2013 | Shimizu et al. | |
| 2013/0342221 A1 | 12/2013 | Virkar et al. | |
| 2014/0004371 A1 * | 1/2014 | Chung | H01B 1/02 428/549 |
| 2014/0238833 A1 | 8/2014 | Virkar et al. | |

FOREIGN PATENT DOCUMENTS

| | | |
|---|---|---|
| TW | 200707466 A | 2/2007 |
| TW | 201230075 A | 7/2012 |
| WO | WO 2013/095971 A1 | 6/2013 |

OTHER PUBLICATIONS

International Preliminary report on Patentability and Written Opinion dated Jun. 12, 2017 in PCT/EP2016/058180.
International Search Report dated Jun. 23, 2016 in PCT/EP2016/058180.
S. Brett Walker, et al. "Reactive Silver Inks for Patterning High-Conductivity Features at Mild Temperatures", Journal of the American Chemical Society, vol. 134, No. 3, 2012, pp. 1419-1421.

* cited by examiner

Primary Examiner — Kuo Liang Peng
(74) Attorney, Agent, or Firm — Oblon, McClelland, Maier & Neustadt, L.L.P.

(57) ABSTRACT

The invention relates to a process for producing a patterned transparent conductive film comprising areas with lower conductivity and areas with higher conductivity, comprising following steps: (a) applying an ink comprising electrically conductive nanoobjects with or without a binder on a substrate, forming a first layer, wherein the amount of conductive nanoobjects is such that the first layer has a low conductivity after drying; (b) drying of the first layer; (c) applying an ink comprising a metallo-organic complex in a predetermined pattern on the first layer; (d) decomposing of the ink applied in step (c), thereby forming a pattern having a higher conductivity on the first layer. The invention further relates to a transparent conductive film, comprising areas with lower conductivity and areas with higher conductivity, wherein the areas with higher conductivity and the areas with lower conductivity comprise nanoobjects and in the areas with higher conductivity, the nanoobjects are fused by metal generated by decomposition of a metallo-organic complex.

20 Claims, No Drawings

PROCESS FOR PRODUCING A PATTERNED TRANSPARENT CONDUCTIVE FILM AND A TRANSPARENT CONDUCTIVE FILM

The invention relates to a process for producing a patterned transparent conductive film comprising areas with lower conductivity and areas with higher conductivity.

Patterned transparent conductive films comprising a transparent conductive layer are used for example in flat liquid crystal displays, touch panels, electroluminescent devices, thin film photovoltaic cells, as anti-static layers, and as electromagnetic wave shielding layers.

The transparent conductive layers generally are composites, comprising an optically transparent contiguous solid phase and a conductive network of electroconductive nanoobjects which extend throughout the solid phase. The solid phase, also referred to as matrix, is formed of one ore more optically transparent polymers. The matrix binds the electroconductive nanoobjects within the layer, fills the voids between the electroconductive nanoobjects, provides mechanical integrity and stability to the layer and binds the layer to the surface of the substrate. The conductive network of electroconductive nanoobjects allows for flow of an electric current between adjacent and overlapping electroconductive nanoobjects within the layer. Due to the small dimensions of the nanoobjects, their influence on the optical behavior of the composite is quite small thus allowing for the formation of an optically transparent composite, i.e. a composite having a light transmission of 80% or more in the visible region (400 to 700 nm) measured according to ASTM D 1003.

A transparent conductive layer and a process for its production are disclosed for example in WO-A 2013/095971. For producing a transparent electrically conductor an electrically conductive layer is disposed onto a transparent substrate. The electrically conductive layer comprises a plurality of interconnecting metallic nanowires and a polymeric overcoat layer. In the electrically conductive layer a pattern is formed, wherein the pattern comprises electrically areas with higher conductivity which are separated by electrically insulating traces. The traces are produced by irradiation with a laser, wherein material of the electrically conductive layer is removed. Therefore, the traces are formed as valleys in the electrically conductive layer. The valleys have a depth in the range from 10 to 100 nm and a cross-sectional width in the range from 10 to 1000 μm. The valleys further comprise a plurality of crevices having a depth in the range from 50 to 100 nm.

Further transparent conductive layers comprising a polymer matrix and conductive nanowires are disclosed in US-A 2007/0074316 or U.S. Pat. No. 8,018,568. In the areas with higher conductivity the nanowires interconnect. The areas with lower conductivity are formed by etching or photopatterning by using photocurable matrix materials.

In these prior art the metal nanowires are completely or partially removed in the patterned areas. Therefore, the pattern may be visible.

US-A 2013/342221 and US-A2014/238833 disclose processes in which in a first step a nonconductive layer comprising metallic nanowires is applied to a substrate. In a following step areas with enhanced conductance according to a pattern are generated. For generating the pattern fusing agents are used which chemically cure the layer comprising metallic nanoobjects into a fused network with enhanced conductance. The fusing agents are for example silver oxide or silver chloride which are deposited onto the nanoobjects comprising layer as a shell which connects adjacent nanowires. These fusing agents may not be the best choices because silver oxide or silver chloride doesn't have good electrical conductivities. The pattern which is produced by these processes also may be visible as due to the additional layer by which additional silver compound is added to connect adjacent nanowires a different refractive index is in that areas where the pattern is conductive.

From S. Walker and J. Lewis, Reactive Silver Inks for Patterning High-Conductivity Features at Mild Temperatures, Journal of the American Chemical Society, 2012, Vol. 134(3), pages 1419 to 1421, an ink is known which decomposes at mild temperature and generates metal silver.

Therefore, it is an object of the present invention to provide a process for producing a patterned transparent conductive film in which nanoobjects are fused by highly conductive metal in the patterned areas and the pattern is not visible.

This object is achieved by a process for producing a patterned transparent conductive film comprising areas with lower conductivity and areas with higher conductivity, comprising following steps:

(a) applying an ink comprising electrically conductive nanoobjects with or without a binder on a substrate, forming a first layer, wherein the amount of conductive nanoobjects is such that the first layer has a low conductivity after drying;
(b) drying of the first layer;
(c) applying an ink comprising a metallo-organic complex in a predetermined pattern on the first layer;
(d) decomposing of the ink applied in step (c), thereby forming a pattern with a higher conductivity on the first layer.

Surprisingly it has been found that by firstly applying a first layer with an ink which comprises conductive nanoobjects in an amount that this layer has a low conductivity after drying and then apply an ink comprising a metallo-organic complex in a predetermined pattern on the first layer for producing a pattern having a higher conductivity, a non-visible conductive pattern can be produced on the substrate, because the number density of nanoobjects is substantially the same in the regions with low conductivity and with higher conductivity.

The substrate onto which the patterned transparent conductive film is applied, generally also is optically transparent. The substrate preferably is made of glass, polycarbonate, polyethylene terephthalate, cyclic olefin polymer, polyimide, thermoplastic polyurethane or polymethyl methacrylate.

According to the invention, a transparent conductive film comprises areas with lower conductivity and areas with higher conductivity, wherein the areas with higher conductivity and the areas with lower conductivity comprise nanoobjects and in the areas with higher conductivity, the nanoobjects are fused by metal generated by decomposition of a metallo-organic complex.

The areas with higher conductivity and the areas with lower conductivity are defined by their sheet resistance. The sheet resistance is a measure of resistance of a sheet namely uniform in thickness. The term "sheet resistance" implies that the current flow is along the plane of the sheet, not perpendicular to it. For a sheet having a thickness t, a length L and a width W, the resistance R is $$R = \rho \cdot \frac{L}{W \cdot t} = \frac{\rho}{t} \cdot \frac{L}{W} = R_{sh} \cdot \frac{L}{W}$$

wherein $R_{sh}$ is the sheet resistance. Accordingly the sheet resistance $R_{sh}$ is $$R_{sh} = R \cdot \frac{W}{L}.$$

In the formula given above, the bulk resistance R is multiplied with a dimensionless quantity (W/L) to obtain the sheet resistance $R_{sh}$, thus the unit of sheet resistance is Ohm. For the sake of avoiding confusion with the bulk resistance R, the value of the sheet resistance is commonly indicated as "Ohm per Square" because in the specific case of a square sheet applies W=L and $R_{sh}$=R. The sheet resistance is measured for example by means of a four point probe.

In the context of the present invention, the terms "lower conductivity" or "low conductivity" mean a sheet resistance of more than 1000 ohms per square (OPS). On the other hand, the terms "higher conductivity" or "high conductivity" refer to a sheet resistance of less than 1000 OPS.

However, it is particularly preferred when the ratio of sheet resistance in the areas with lower conductivity and the areas with higher conductivity is larger than 1000. In a particular preferred embodiment, the ratio of sheet resistance in the areas with lower conductivity and the areas with higher conductivity is larger than 10000. The sheet resistance of the areas with lower conductivity preferably is larger than 100,000 ohms per square (OPS), more preferred larger than 1,000,000 OPS, and particularly larger than 10,000,000 OPS. The sheet resistance of the areas with higher conductivity preferably is smaller than 1000 OPS, more preferred in the range from 5 to 500 OPS, and particularly in the range from 10 to 100 OPS.

To achieve a non-visible patterned transparent conductive film, the difference in light transmission of the areas with lower conductivity and the areas with higher conductivity preferably is less than 5%. Particularly preferred, the difference in light transmission of the areas with lower conductivity and the areas with higher conductivity is less than 0.5%. The light transmission refers to the percentage of an incident light which is transmitted through a medium. The light transmission of the areas with higher conductivity according to the invention is at least 80%, measured according to ASTM D 1003 (Procedure A), published November 2013. More preferred, the light transmission is at least 85%, further preferably at least 90% and particularly preferably at least 95%, in each case measured according to ASTM D 1003 (Procedure A), published November 2013.

The difference in haze of the areas with lower conductivity and the areas with higher conductivity preferably is less than 0.5%. Particularly preferred the difference in haze is less than 0.01%. The haze of the areas with higher conductivity of the transparent conductive layer is preferably 2% or less, more preferably 1.8% or less, further preferably 1.5% or less and particularly preferably 1.2%, in each case measured according to ASTM D 1003 (Procedure A).

The measurement of haze and light transmission (in ASTM D 1003 referred to as luminous transmittance which is the ratio of the luminous flux transmitted by a body to the flux incident upon it) by means of a hazemeter is defined in ASTM D 1003 as "Procedure A—Hazemeter". The values of haze and light transmission (corresponding to the luminous transmittance as defined in ASTM D 1003) given in the context of the present invention refer to this procedure.

Generally haze is an index of the light diffusion. It refers to the percentage of the quantity of light separated from the incident light and scattered during transmission. It is typically caused by surface roughness, and by embedded particles or compositional heterogeneities in the medium.

According to ASTM D 1003, in transmission, haze is the scattering of light by a specimen responsible for the reduction in contrast of objects viewed through said specimen, i.e. the percent of transmitted light that is scattered so that its direction deviates more than a specified angle (2.5°) from the direction of the incident beam.

A nanoobject in regard to the present invention is an object having one, two, or three external dimensions in the nanoscale, i.e. in the size range from approximately 1 nm to 100 nm. The electrically conductive nanoobjects to be used for the present invention are electrically conductive nanoobjects having two external dimensions in the range from 1 nm to 100 nm and their third external dimension in the range from 1 μm to 100 μm. Typically, said two external dimensions which are in the range from 1 nm to 100 nm are similar, i.e. they differ in size by less than three times. The third dimension of the electrically conductive nanoobjects is significantly larger, i.e. it differs from the other two external dimensions by more than three times. Such nanoobjects also are referred to as nanofibers.

The electrically conductive nanoobjects used in the present invention are preferably nanowires or nanotubes. Nanowires are electrically conductive nanofibers, nanotubes are hollow nanofibers.

Electrically conductive nanoobjects used for the present invention typically have a cross section close to circular shape. Said cross section extends perpendicularly to said external dimension which is in the range of from 1 μm to 100 μm. Thus, said two external dimensions which are in the nanoscale are defied by the diameter of said circular cross section. Said third external dimension extending perpendicular to said diameter is referred to as the length.

Preferably, the electrically conductive nanoobjects have a length in the range from 1 μm to 500 μm, more preferably from 3 μm to 100 μm, and particularly preferably from 10 μm to 50 μm. The diameter of the electrically conductive nanoobjects preferably is in the range from 1 nm to 100 nm, more preferably from 2 nm to 50 nm, particularly preferably from 3 nm to 30 nm.

To provide a sufficient electrical conductivity, the electrically conductive nanoobjects are made of a metal or carbon. Preferably, the electrically conductive nanoobjects are made of silver, copper, gold, platinum, palladium, nickel or carbon. In case the electrically conductive nanoobjects are made of a metal, preferably silver, copper, gold, platinum, palladium, or nickel, the nanoobjects preferably are nanowires. In case the electrically conductive nanoobjects are made of carbon, the nanoobjects preferably are nanotubes. Particularly preferably, the nanoobjects are silver nanowires, gold nanowires or copper nanowires, particularly silver nanowires.

Nanowires made of metals, for example silver nanowires, are typically commercially available in the form of an aqueous dispersion wherein polyvinylpyrrolidone is adsorbed onto the surface of the nanowires in order to render the dispersion stable. Any matter adsorbed on the surface of the nanowires is not included in the above-defined dimensions and composition of the electrically conductive nanoobjects.

To achieve a first layer which has a low conductivity, the ink comprising electrically conductive nanoobjects which is applied in step (a) to form the first layer preferably comprises from 0.01 to 0.5 wt-%, particularly preferably from 0.01 to 0.1 wt-% electrically conductive nanoobjects and solvent. In one embodiment, the ink additionally comprises from 0.02 to 2.5 wt-%, particularly preferably from 0.02 to 0.3 wt-% binder. In a particularly preferred embodiment, the ink is free from binder.

The binder which may be comprised in the ink forms the matrix of the first layer by drying. To provide an ink, which can be applied to the substrate, the solvent is selected such that the binder is soluble in the solvent or can be dispersed in the solvent as particles or fibers. As the nanowires are not soluble, the nanowires are dispersed in the solvent comprising the solved or dispersed binder. The binder is preferably selected from the group consisting of hydropropyl methyl cellulose, methyl cellulose, styrene(meth)acrylic copolymers, crystalline cellulose, poly(meth)acrylates, copolymers of acrylates and methacrylates, copolymers of styrene and (meth)acrylates, carboxymethyl cellulose, poly acrylamide, polyvinylalcohol, polyvinylpyrrolidone, polystyrenesulfonic acid, dextran or blends thereof.

If a binder is used, the solvent preferably is water. However, if polymers are used as binder which are not soluble in water or cannot be dispersed in water as particles or fibers, the solvent preferably is an organic solvent. Preferably, the solvent is selected from the group consisting of alcohols, ketones, ethers, hydrocarbons or aromatic solvents. Suitable aromatic solvents are for example benzene, toluene ore xylene. Particularly preferred, however, the binder is selected from polymers which are water soluble and the solvent is water. In some cases the solvent can be a mixture of two or more miscible solvents, for example, water and isopropanol.

When no binder is used, the solvent may be water or an organic solvent. Preferably, the solvent in this embodiment is an organic solvent. The organic solvent preferably is selected from the same solvents as used in the case a binder is comprised.

Preferably, the ink comprising the electrically conductive nanowires is applied to the surface of the substrate in a thickness in a range of from 100 nm to 40 µm, preferably of from 200 nm to 15 µm. The thickness is also referred to as "wet thickness" and relates to the state before removing the liquid constituents of the ink by drying. At a given target thickness (after removing the liquid constituents of the composition as explained above) and accordingly a given target sheet resistance and light transmission of the electroconductive layer to be prepared, the wet thickness may be the higher the lower the concentration of solid constituents in the composition is in the ink. The process of applying the ink is facilitated when there is no need to use a particular low wet thickness.

After applying the ink to the substrate, the layer which is formed by applying the ink is dried to remove solvent and to achieve a solid first layer. The solid first layer which is formed from the ink by drying preferably has a thickness in the range from 1 nm to 200 nm, preferably from 5 nm to 100 nm.

The drying of the first layer preferably is carried out at a temperature in the range from 20 to 200° C. for 0.5 to 30 min. Particularly preferably the drying is carried out at a temperature in the range from 30 to 150° C. The duration of the drying process particularly preferably is in the range from 1 to 15 min.

The temperature at which the drying process is carried out depends on the solvent used, the melting point of the nanowires and the coating process. For silver nanowires, the upper limit is about 200° C. If a solvent is used which evaporates easily, a lower temperature, for example ambient temperature, can be used. On the other hand, a higher temperature for drying the layer has to be used in case the solvent does not evaporate at low temperatures or only a small amount of the solvent evaporates. To accelerate the drying process, the drying preferably is carried out at higher temperatures of at least 100° C. However, when the ink is applied to the substrate by roll-to-roll coating such as gravure printing, flexoprinting and slot-die coating, the drying of layers may be carried out in ambient conditions.

The duration of the drying process depends on the drying temperature, the solvent used, the solid content in the wet film and the wet film thickness. The duration is selected such that at the end of the drying process the residual moisture content in the ink is below a defined value. To achieve the desired residual moisture content, the duration of evaporation increases with decreasing temperature for the same solvent.

In case water is used as a solvent, generally the drying is carried out at a temperature in the range from 100 to 150° C. for a duration of 1 to 15 min. In some cases such as roll-to-roll coating, the drying can also be carried out in ambient temperature.

The atmosphere in which the drying is carried out is preferably selected such that no chemical reaction takes place between any component of the atmosphere and the ink. The atmosphere in which the drying of the first layer is carried out preferably comprises air, nitrogen or noble gases, for example argon. Particular preference is given to air or nitrogen.

Due to the amount of electrically conductive nanoobjects in the ink which forms the first layer and the thickness of the first layer, the first layer has a low conductivity. To form a pattern having a higher electrical conductivity, the ink comprising a metallo-organic complex is applied onto the first layer in step (c) in the desired pattern for the areas with higher conductivity.

Typically, the pattern comprises lines with lower conductivity and areas with higher conductivity which are surrounded by the lines with lower conductivity. The width of the lines with lower conductivity preferably is in the range from 10 to 1000 µm, particularly in the range from 50 to 500 µm.

The metal of the metallo-organic complex can be any suitable metal which can be present in form of a complex and which is able to decompose at mild temperature to form areas with higher conductivity on the first layer in connection with the electrically conductive nanoobjects. A mild temperature in context of the present invention is a temperature of less than 150° C., preferably of less than 100° C. Suitable metals are for example the same metals as used for the electrically conductive nanoobjects, preferably silver, gold, copper or platinum. Particularly preferred as metal is silver.

As coordinating ligands, all suitable ligands to form the metallo-organic complex which are able to decompose at mild temperature can be used. However, preference is given to ligands which are selected from carboxylic acid and derivatives of carboxylic acids, ammonium carbonate, ammonium carbamate or a set of ligands including at least one ammonia ligand and other ligands such as nitrate, acetate, sulfate, chloride, cyanide or pyridine. Particular preference is given to ammonium carbonate. A particular preferred metallo-organic complex is silver ammonium carbonate.

The concentration of the metallo-organic complex in the ink preferably is in a range from 0.0001 to 1 mol/l. Particularly preferred the concentration is in a range from 0.001 to 0.1 mol/l.

Suitable solvents in which the metallo-organic complex is solved to form the ink are water or organic solvents. As organic solvents the same solvents can be used as for the ink comprising the electrically conductive nanoobjects. Suitable organic solvents are for example alcohols, ketones, ethers, hydrocarbons or aromatic solvents. Suitable aromatic solvents are for example benzene, toluene ore xylene. Preference is given to water or alcohols as solvent.

Suitable processes to apply the ink comprising the electrically conductive nanowires in step (a) as well as the ink comprising the metallo-organic complex in step (c) are spin-coating, draw down coating, roll-to-roll coating, gravure printing, microgravure printing, screen-printing, flexo-printing and slot-die coating. Thereby it is possible to use the same process for applying the ink comprising the electrically conductive nanowires in step (a) and the ink comprising the metalloorganic complex in step (c). However, it is also possible to use different printing processes for application of the first layer in step (a) and the ink comprising the metallo-organic complex in step (c). During the application of the ink comprising the metallo-organic complex in step (c), a mask can be used to define patterns and protect the areas that are not to be contacted by the metallo-organic complex.

After application of the ink comprising the metallo-organic complex, a decomposing step is performed to form a pattern with a higher electrical conductivity onto the first layer. The decomposing step thereby, preferably, is carried out in the same manner as the drying step for the first layer. Preferably, the decomposing is carried out at a temperature in the range from 20 to 150° C. for 0.5 to 30 min. Particularly preferably the decomposing is carried out at a temperature in the range from 30 to 150° C. The duration of the decomposing process particularly preferably is in the range from 1 to 15 min. Light irradiation may also be involved during the decomposition step. During the decomposing step, the ink simultaneously is dried.

EXAMPLES

Manufacturing Example 1: Preparation of Silver Nanowire Films on Glass Substrates A dispersion of silver nanowires in water with an amount of 0.5 wt-% silver nanowires and a solution of 1 wt-% hydroxypropyl methylcellulose (HPMC) in water are mixed in water so that the final concentration of the silver nanowires ins 0.05 wt-% and the mass ratio of HPMC and silver nanowires is 2:1, respectively. The mixture is spin coated on glass substrate at 1000 rpm for 30 sec and dried for 5 min at 135° C. The sheet resistance is measured by a 4 point probe station (Lucas lap pro-4) and the optical properties are measured by BYK haze gard plus.

Manufacturing Example 2: Preparation of Silver-Organic Complex Ink in Water 1.67 g (10 mmol) silver acetate is added to 5 ml of water upon stirring at room temperature. 3 ml (2.7 g) of 28% ammonia solution in water is added dropwise to the suspension of silver acetate within ca. 2 min and the mixture is allowed to stir for a couple of minutes to dissolve the silver acetate. 0.316 g (5 mmol) of ammonium formate is dissolved in 2 ml of water and this solution is added to the solution of silver acetate to provide ca. 10.5 ml of particle-free silver ink. The ink is filtered by a 0.45 µm syringe filter prior to use.

Manufacturing Example 3: Preparation of Silver-Organic Complex Ink in Ethanol 1.67 g (10 mmol) silver acetate is added to 7 ml of ethanol upon stirring at room temperature. 1.83 ml (25 mmol) of n-butylamine is added dropwise to the suspension of silver acetate within ca. 2 min and the mixture is allowed to stir for a couple of minutes to dissolve the silver acetate. 0.316 g (5 mmol) of ammonium formate is dissolved in 1 ml of water and this solution is added to the solution of silver acetate to provide ca. 10.5 ml of particle-free silver ink. The ink is filtered by a 0.45 µm syringe filter prior to use.

Manufacturing Example 4: Preparation of Silver Nanowire Films on Glass Substrates A dispersion of silver nanowires in isopropanol with an amount of 0.13 wt-% silver nanowires is spin coated on glass substrate at 1000 rpm for 30 sec. The sheet resistance is measured by a 4 point probe station (Lucas lap pro-4) and the optical properties are measured by BYK haze gard plus.

Examples 1 and 2

Silver-organic complex ink which has been prepared according to manufacturing example 2 is diluted to various concentrations by water and spin coated at 1000 rpm for 30 sec onto a silver nanowire film prepared according to manufacturing example 1. The film is then dried for 5 min at 135° C. The sheet resistance (Rsh) and optical properties (transmittance T and haze H) then are measured as in manufacturing example 1. The results are shown in table 1. In table 1 "before" indicates the results of the nanowire film which has been prepared according to manufacturing example 1 and "after" indicates the results after application of the silver-organic complex ink.

TABLE 1

| Example | Dilution factor for silver-organic complex ink | Rsh before [OPS] | Rsh after [OPS] | T before [%] | T after [%] | H before [%] | H after [%] |
|---|---|---|---|---|---|---|---|
| 1 | 100 | 1606 ± 235 | 723 ± 30 | 92.9 | 89.7 | 0.29 | 0.74 |
| 2 | 500 | 1699 ± 339 | 734 ± 73 | 92.9 | 92.4 | 0.26 | 0.29 |

Example 3

Silver-organic complex ink which has been prepared according to manufacturing example 3 is diluted 500 times by ethanol and spin coated at 1000 rpm for 30 sec onto a silver nanowire film prepared according to manufacturing example 1. The film is then dried for 5 min at 135° C. The sheet resistance (Rsh) and optical properties (transmittance T and haze H) then are measured as in manufacturing example 1. The results are shown in table 2. In table 2 "before" indicates the results of the nanowire film which has been prepared according to manufacturing example 1 and "after" indicates the results after application of the silver-organic complex ink.

TABLE 2

| Example | Dilution factor for silver-organic complex ink | Rsh before [OPS] | Rsh after [OPS] | T before [%] | T after [%] | H before [%] | H after [%] |
|---|---|---|---|---|---|---|---|
| 3 | 500 | 1079 ± 218 | 607 ± 49 | 93.0 | 92.1 | 0.27 | 0.28 |

Example 4

Silver-organic complex ink which has been prepared according to manufacturing example 2 is diluted by a factor of 10000 by water and drop coated onto a silver nanowire film prepared according to manufacturing example 4. The film is then dried for 5 min at 135° C. The sheet resistance (Rsh) and optical properties (transmittance T and haze H) then are measured as in manufacturing example 1. The results are shown in table 3. In table 3 "before" indicates the results of the nanowire film which has been prepared according to manufacturing example 4 and "after" indicates the results after application of the silver-organic complex ink.

TABLE 3

| Example | Dilution factor for silver-organic complex ink | Rsh before [OPS] | Rsh after [OPS] | T before [%] | T after [%] | H before [%] | H after [%] |
|---|---|---|---|---|---|---|---|
| 4 | 10000 | >20k | 57 ± 7 | 91.4 | 91.1 | 0.82 | 0.87 |

Example 5

Silver-organic complex ink which has been prepared according to manufacturing example 3 is diluted by a factor of 1000 by water and spin coated at 1000 rpm for 30 sec onto a silver nanowire film prepared according to manufacturing example 4. The film is then dried for 5 min at 135° C. The sheet resistance (Rsh) and optical properties (transmittance T and haze H) then are measured as in manufacturing example 1. The results are shown in table 4. In table 4 "before" indicates the results of the nanowire film which has been prepared according to manufacturing example 4 and "after" indicates the results after application of the silver-organic complex ink.

TABLE 4

| Example | Dilution factor for silver-organic complex ink | Rsh before [OPS] | Rsh after [OPS] | T before [%] | T after [%] | H before [%] | H after [%] |
|---|---|---|---|---|---|---|---|
| 5 | 1000 | >20k | 83 ± 6 | 91.9 | 91.0 | 0.64 | 0.69 |

The invention claimed is:

1. A process for producing a patterned transparent conductive film comprising areas with lower conductivity and areas with higher conductivity, the process comprising:
   (a) applying an ink comprising electrically conductive nanoobjects with or without a binder on a substrate, thereby forming a first layer, wherein an amount of the electrically conductive nanoobjects is such that the first layer has a low conductivity after drying;
   (b) drying the first layer;
   (c) applying an ink comprising a metallo-organic complex in a predetermined pattern on the first layer, wherein the metallo-organic complex comprises one or more ligands selected from the group consisting of a carboxylic acid and a derivative of a carboxylic acid; and
   (d) decomposing the ink applied in (c), thereby forming a pattern with a higher conductivity on the first layer, wherein the areas with lower conductivity and the areas with higher conductivity have the same number density of conductive nanoobjects.

2. The process according to claim 1, wherein the electrically conductive nanoobjects are nanowires or nanotubes.

3. The process according to claim 1, wherein the electrically conductive nanoobjects comprise silver, copper, gold, platinum, palladium, nickel or carbon.

4. The process according to claim 1, wherein the electrically conductive nanoobjects have a diameter in a range from 1 to 100 nm and a length in a range from 1 to 100 μm.

5. The process according to claim 1, wherein the ink comprising electrically conductive nanoobjects comprises from 0.01 to 0.5 wt-% electrically conductive nanoobjects and solvent.

6. The process according to claim 5, wherein the ink further comprises from 0.02 to 2.5 wt-% binder.

7. The process according to claim 6, wherein the solvent is at least one solvent selected from the group consisting of water, an alcohol, a ketone, an ether, a hydrocarbon and an aromatic solvent.

8. The process according to claim 1, wherein the ink comprising the electrically conductive nanoobjects is applied such that a wet thickness of the first layer is in a range from 100 nm to 40 Pun.

9. The process according to claim 1, wherein the drying in (b) and the decomposing in (d) each are carried out at a temperature in a range from 20 to 200° C. for 0.5 to 30 min.

10. The process according to claim 1, wherein the metal of the metallo-organic complex is at least one selected from the group consisting of silver, gold, copper and platinum.

11. The process according to claim 1, wherein the metallo-organic complex further comprises at least one ligand selected from the group consisting of ammonium carbonate, ammonium carbamate, ammonia, nitrate, acetate, sulfate, chloride, cyanide and pyridine.

12. The process according to claim 1, wherein a concentration of the metallo-organic complex in the ink comprising the metallo-organic complex is in a range from 0.0001 to 1 mol/l.

13. The process according to claim 1, wherein the application of the ink comprising electrically conductive nanoobjects in (a) and the application of the ink comprising the metallo-organic complex in (c) each are carried out independently by spin coating, draw down coating, roll-to-roll coating, gravure printing, microgravure printing, screen-printing, flexoprinting or slot-die coating.

14. The process according to claim 1, wherein a sheet resistance of the areas with lower conductivity is greater than 100,000 ohms per square.

15. The process according to claim 1, wherein a ratio of a sheet resistance of the areas with lower conductivity to a sheet resistance of the areas with higher conductivity is greater than 1,000.

16. A transparent conductive film, comprising areas with lower conductivity and areas with higher conductivity, wherein the areas with higher conductivity and the areas with lower conductivity comprise nanoobjects and in the areas with higher conductivity, the nanoobjects are fused by metal generated by decomposition of a metallo-organic complex, wherein the metallo-organic complex comprises one or more ligands selected from the group consisting of a carboxylic acid and a derivative of a carboxylic acid, wherein the areas with lower conductivity and the areas with higher conductivity have the same number density of conductive nanoobjects.

17. The transparent conductive film according to claim 16, wherein the nanoobjects are nanowires or nanotubes.

18. The transparent conductive film according to claim 16, wherein the nanoobjects comprise silver, copper, gold, platinum, palladium, nickel or carbon.

19. The transparent conductive film according to claim 16, wherein a sheet resistance of the areas with lower conductivity is greater than 100,000 ohms per square.

20. The transparent conductive film according to claim 16, wherein a ratio of a sheet resistance of the areas with lower conductivity to a sheet resistance of the areas with higher conductivity is greater than 1,000.

* * * * *

UNITED STATES PATENT AND TRADEMARK OFFICE
CERTIFICATE OF CORRECTION

PATENT NO. : 10,800,940 B2  
APPLICATION NO. : 15/566262  
DATED : October 13, 2020  
INVENTOR(S) : Zhang et al.

Page 1 of 1

It is certified that error appears in the above-identified patent and that said Letters Patent is hereby corrected as shown below:

On the Title Page

Column 1, Item (51), under "Int. Cl.", Lines 2-9, delete
"*C09D 11/52*   (2014.01)
*C09D 11/037*  (2014.01)
*H05K 1/09*    (2006.01)
*C09D 11/14*   (2006.01)
*C23C 18/06*   (2006.01)
*H01B 1/20*    (2006.01)
*H01B 5/14*    (2006.01)
*C08K 7/06*    (2006.01)
*C08K 3/08*    (2006.01)" should read -- *C09D 11/52*   (2014.01) --.

In the Claims

In Column 10, Claim 8, Line 38, "Pun." should read -- μm. --.

Signed and Sealed this  
Eighteenth Day of May, 2021

Drew Hirshfeld  
*Performing the Functions and Duties of the*  
*Under Secretary of Commerce for Intellectual Property and*  
*Director of the United States Patent and Trademark Office*